United States Patent [19]

Guertler et al.

[11] Patent Number: 5,492,193
[45] Date of Patent: Feb. 20, 1996

[54] ARRANGEMENT OF A MOTOR VEHICLE DRIVING ENGINE

[75] Inventors: Dieter Guertler, Stuttgart; Gunther Ellenrieder, Ostfildern, both of Germany

[73] Assignee: Mercedes-Benz AG, Germany

[21] Appl. No.: 287,009

[22] Filed: Aug. 8, 1994

[30] Foreign Application Priority Data

Aug. 6, 1993 [DE] Germany .................. 43 26 396.8

[51] Int. Cl.⁶ .................. B60K 5/00; B62D 27/00
[52] U.S. Cl. .................. 180/232; 180/274; 280/784
[58] Field of Search .................. 180/232, 274; 280/784

[56] References Cited

U.S. PATENT DOCUMENTS

| | | | |
|---|---|---|---|
| 3,589,466 | 6/1971 | Dudley | 180/232 |
| 3,743,347 | 7/1973 | Shaw | 296/35.1 |
| 3,752,247 | 8/1973 | Schwenk | 180/232 |
| 3,774,712 | 11/1973 | Froumajou | 180/232 |
| 3,827,525 | 8/1974 | Felzer | 180/232 |

FOREIGN PATENT DOCUMENTS

| | | |
|---|---|---|
| 0196871A3 | 10/1986 | European Pat. Off. . |
| 2670737 | 6/1992 | France . |
| 1630968 | 4/1971 | Germany . |
| 2152136 | 4/1973 | Germany . |
| 2241651 | 3/1974 | Germany . |
| 2402163 | 8/1974 | Germany . |
| 8805903 | 8/1988 | Germany . |
| 3801347 | 7/1989 | Germany . |
| 4230722 | 4/1993 | Germany . |

OTHER PUBLICATIONS

Leichtbau ja, aber, Krafthand, Jan. 22, 1994, pp. 20–22 and 24.

*Primary Examiner*—Kenneth R. Rice
*Attorney, Agent, or Firm*—Evenson, McKeown, Edwards & Lenahan

[57] ABSTRACT

A motor vehicle driving engine arrangement for use in vehicles with an extremely short forward portion in which the engine is reliably prevented from penetrating into the passenger compartment. The driving engine is installed at an acute angle while being sloped with respect to the horizontal line that important areas of the driving engine extend behind the front axle. A downward-pointing rigid sliding surface is formed by an area of an end wall face approximately parallel to the acute angle for the driving engine which is displaceable toward the rear during a frontal impact. Forward and rearward engine mounts or bearings of an auxiliary frame carrying the driving engine are constructed or dimensioned so that, during a frontal impact, the driving engine remains connected with the vehicle via the forward engine mounts or bearings of an auxiliary frame carrying the driving engine, while the rearward engine mounts or bearings of an auxiliary frame carrying the driving engine are destroyed or released.

7 Claims, 3 Drawing Sheets

ARRANGEMENT OF A MOTOR VEHICLE DRIVING ENGINE

BACKGROUND AND SUMMARY OF THE INVENTION

The present invention relates to an arrangement of a driving engine of a motor vehicle.

It is an object of the present invention to arrange a driving engine of a motor vehicle so that, even when the length of the forward structure is extremely short, no block formation will occur during a frontal impact and the entire length of the forward structure will be available for carrying out deformation work.

This object has been achieved in accordance with the present invention by installing the driving engine in such a manner at an acute angle while being sloped with respect to the horizontal line that important areas of the driving engine extend behind the front axle. Approximately parallel to the above and by way of an area of the end face wall, a downward-pointing rigid sliding surface is formed for the driving engine which was displaced toward the rear during a frontal impact. Forward-and rearward engine mounts or bearings of an auxiliary frame carrying the driving engine are constructed or dimensioned such that, during a frontal impact, the driving engine remains connected with the vehicle via the forward engine mounts or bearings of an auxiliary frame carrying the driving engine, while the rearward-engine mounts or bearings of an auxiliary frame carrying the driving engine are destroyed or released.

BRIEF DESCRIPTION OF THE DRAWINGS

These and other objects, features and advantages of the present invention will become more readily apparent from the following detailed description thereof when taken in conjunction with the accompanying drawings wherein.

DETAILED DESCRIPTION OF THE DRAWINGS

Figure 1:
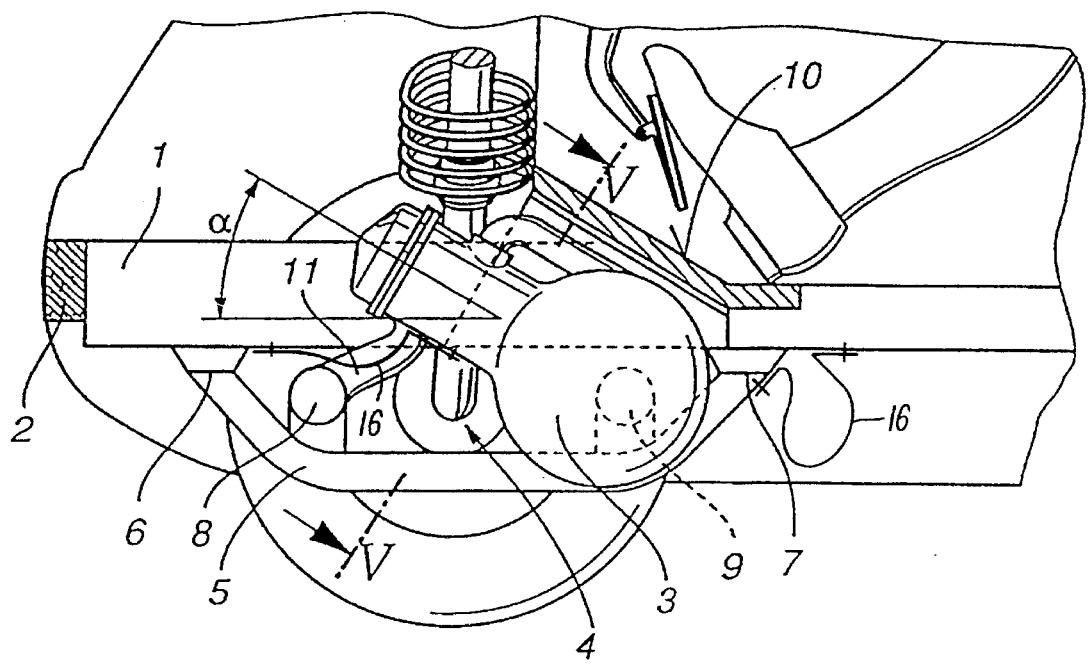
FIG. 1 is a partial sectional view in a longitudinal center plane of a motor vehicle forward structure, in which the driving engine is fastened to the vehicle by an auxiliary frame.
Figure 2:
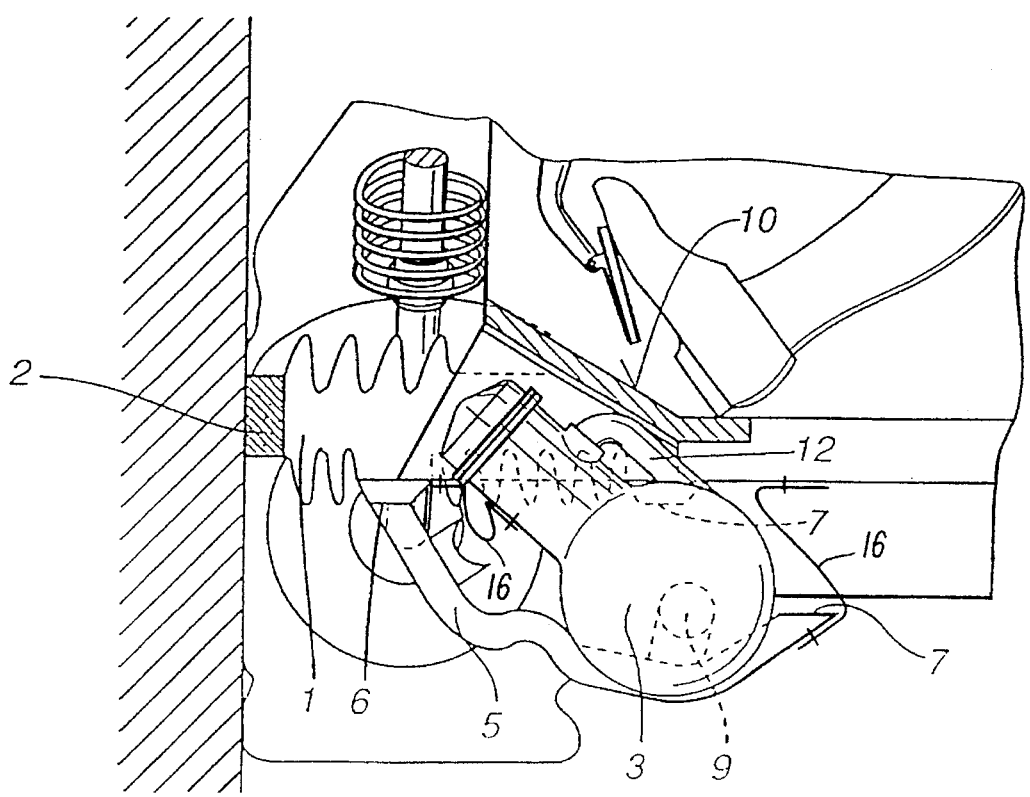
FIG. 2 is a view of the structure shown in FIG. 1 but after a frontal impact.
Figure 3:
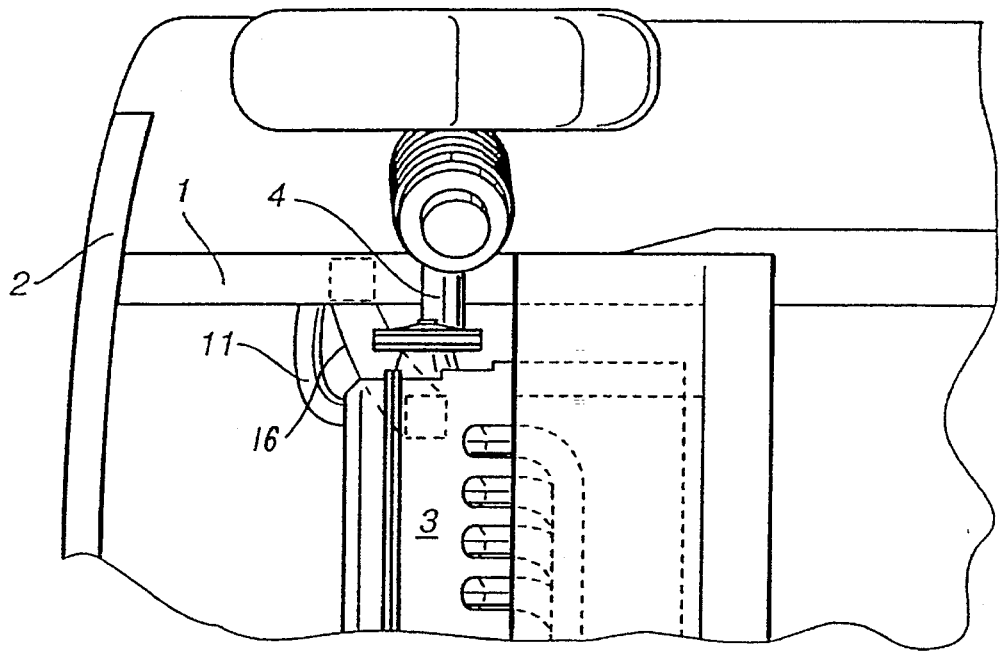
FIG. 3 is a top view of the structure shown in FIG. 1.

The forward structure of a motor vehicle partially illustrated in FIGS. 1 to 3 comprises front rails 1, with an additional deformation element 2 being connected forward of these front rails 1. A driving engine 3 in the form, for example, of a transversely installed piston engine with a transmission which is flanged on in series is arranged sloped with respect to a horizontal line at an angle α of approximately 30° such that it extends, by way of important or preselected areas, behind the front axle 4 and only portions of the cylinders are situated above the front axle 4. With an in-line piston engine, the cylinder axes are sloped with respect to the horizontal line at an angle of about 30° which is open toward the front of the vehicle.

The driving engine 3 is fastened to the vehicle by an auxiliary frame 5 which is connected with the front rail 1 at two bearings 6 and 7. The driving engine 3 is held on the auxiliary frame 5 by forward bearings 8 and rearward bearings 9. At the same angle α at which the driving engine 3 is sloped with respect to the horizontal line, a stiff sliding surface 10 extends adjacent to the driving engine 3 which is formed by an area of the end face wall. The sliding surface 10 can be reinforced, for example, by a double layer, a sandwich construction or other suitable reinforcing arrangement.

In the case of a frontal impact, the result of which are illustrated in FIG. 2, the front rail 1 is shortened and the rearward bearing 7 of the auxiliary frame 5 at the front rail 1 is destroyed while the forward bearing 6 remains intact. The forward engine bearing 8, at which the driving engine 3 is supported via a strut 11, may also be destroyed, but the driving engine 3 which forms a block is then pushed downwardly along the sliding surface 10 via its exhaust manifolds 12, the engine or transmission casing or other driving components without penetrating into the passenger compartment.

Figure 4:
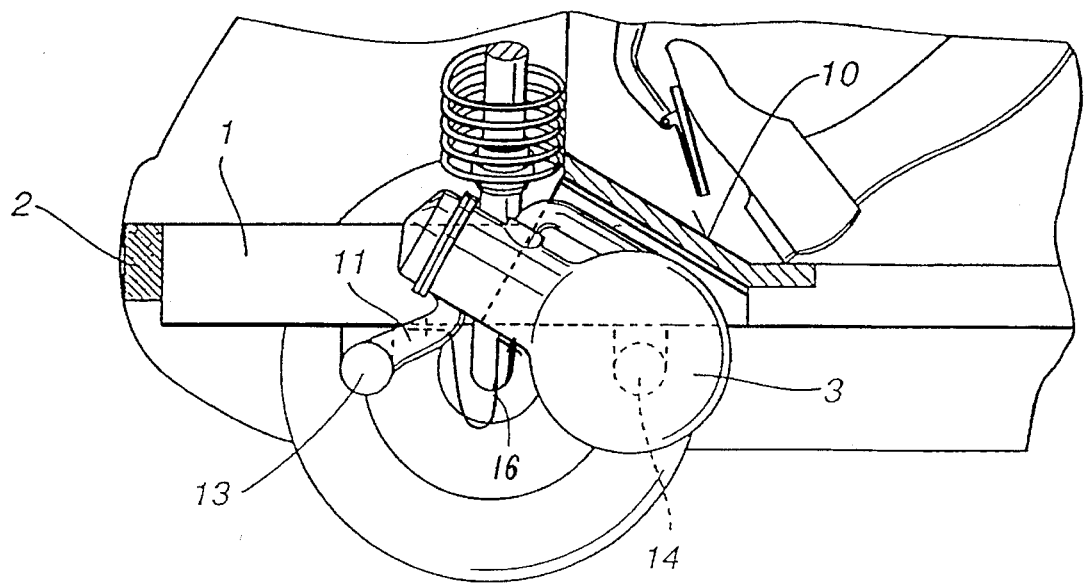
FIG. 4 is a view similar FIG. 1 but showing another embodiment of the present invention with a driving engine fastened directly to the vehicle.

In the embodiment illustrated in FIG. 4, the auxiliary frame is eliminated, and the driving engine 3 is disposed via a forward engine bearing by way of the strut 11 and a rearward engine bearing 14 directly on the front rail 1. In the event of a crash, only the rearward engine bearing 14 is destroyed or released and the driving engine 3 is displaced downwardly without forming a block as in the case of the above-described embodiment.

Figure 5:
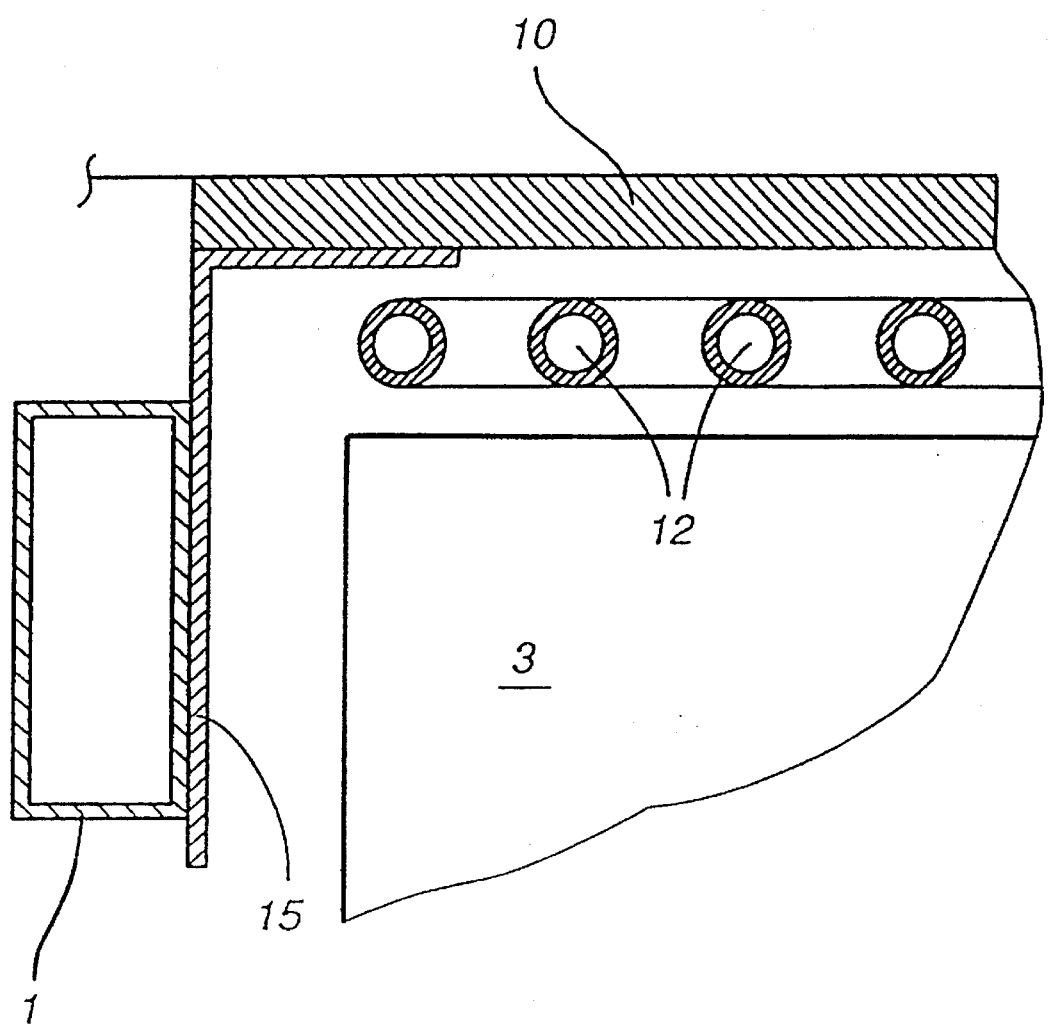
FIG. 5 is a sectional view along line V—V of FIG. 1.

Finally, as illustrated in FIG. 5, for an additional reinforcement, the front rail 1 and the sliding surface 10 may be connected by a bent plate 15 which forms a primary contact surface.

In all embodiments, it is important that the parts of the driving engine which first come in contact with the sliding surface or the primary contact surface are constructed to have a surface that is as smooth as possible and have no projecting edges or the like in order to facilitate a perfect sliding-away of the driving engine in the downward direction. Also, the clearance above the road surface is selected such that the driving engine 3 is pushed completely under the motor vehicle in the event of a frontal impact. Catch bands 16 can be provided in the area of the forward engine mounts as bearings 6, 7, of the auxiliary frame 5.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. An arrangement of a motor vehicle driving engine installed at an acute angle and being sloped with respect to a horizontal line such that preselected areas of the driving engine extend behind a front axle of a motor vehicle, comprising an area of a vehicle end face wall forming a downward-pointing rigid sliding surface approximately parallel to the acute angle for the driving engine displaceable toward a rear direction of the motor vehicle during a frontal impact; and an auxiliary frame having forward and rearward engine mounts or bearings arranged to carry the driving engine and configured so that, during the frontal impact, the driving engine remains connected with the motor vehicle via the forward engine mounts or bearings of the auxiliary frame and the rearward engine mounts or bearings of the auxiliary frame are one of destroyed and released.

2. The arrangement according to claim 1, wherein the driving engine is a transversely installed piston engine with a transmission which is flanged on in series.

3. The arrangement according to claim 1, wherein the sliding surface is reinforced by one of a double layer and a sandwich structure.

4. The arrangement according to claims 2, wherein the piston engine is an in-line engine with cylinder axes which extend sloped with respect to the horizontal line at an angle of approximately 30° which is open toward a front direction of the motor vehicle.

5. The arrangement according to claim 1, wherein a catch band is provided in the area of the forward engines mounts or bearings of the auxiliary frame.

6. The arrangement according to claim 1, wherein a clearance between the motor vehicle and a road surface is such that the driving engine is pushable completely under the motor vehicle in the event of the frontal impact.

7. Arrangement according to claim 1, wherein a bent plate connects a front rail and the sliding surface.

* * * * *